Nov. 29, 1966 J. G. NEEDHAM ETAL 3,288,700

SPUTTERING APPARATUS INCLUDING A FOLDED FLEXIBLE CONVEYOR

Filed Oct. 23, 1963 7 Sheets-Sheet 1

SPUTTERING APPARATUS INCLUDING A FOLDED FLEXIBLE CONVEYOR

Filed Oct. 23, 1963 7 Sheets-Sheet 7

3,288,700
SPUTTERING APPARATUS INCLUDING A FOLDED FLEXIBLE CONVEYOR

James Garland Needham, Arnprior, Ontario, and Neville Cary Davies and James Hallam Ranshaw, Ottawa, Ontario, Canada, assignors to Northern Electric Company Limited, Montreal, Quebec, Canada
Filed Oct. 23, 1963, Ser. No. 318,226
14 Claims. (Cl. 204—298)

Figure 1:
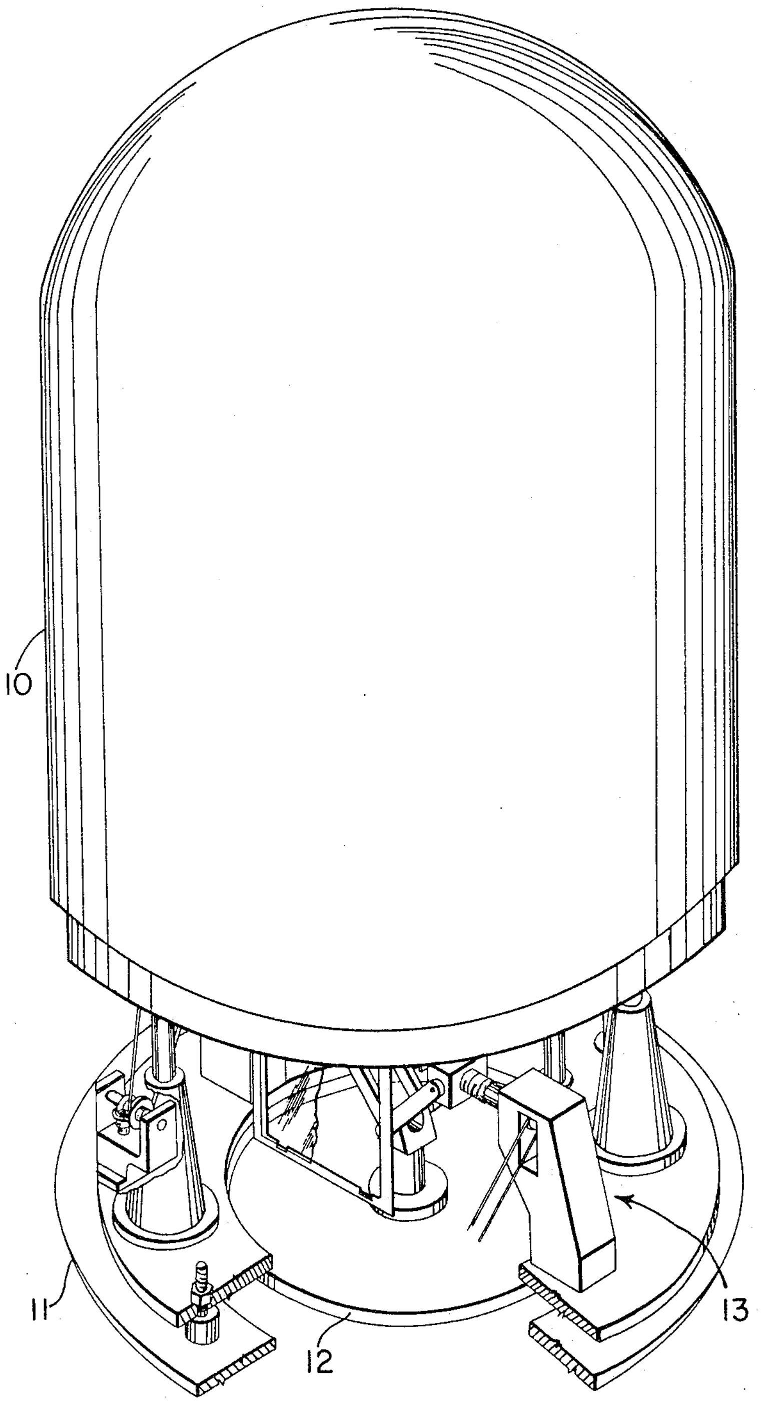

The present invention relates to an apparatus for the production of thin film circuits and in particular to an improved sputtering apparatus for the production of thin films on flat insulating substrates.

Thin film circuits have become increasingly important in the field of electronics in view of the small volume occupied by the circuits. These circuits are normally formed by coating a flat substrate with a thin film of material. The type of material to be used as a coating, and the type of substrate depends upon the desired circuit function. Magnetic and insulating films can be deposited on conducting substrates to form a great variety of electrical components. These components can be interconnected in various ways to perform the desired circuit function. The geometry of the components and connecting conductors is controlled by evaporation through a mask or controlled etching of certain areas.

Tantalum thin film circuitry is an example of one of the above techniques. Films for the fabrication of resistors are tantalum nitride, the surface of which may be oxidized to increase the resistance. Capacitors may be fabricated by oxidizing tantalum films to form of a tantalum pentoxide dielectric layer, and subsequent application of a conducting film to form a sandwich structure. The thin film coatings are applied by sputtering at low pressure or evaporation in a high vacuum atmosphere. Sputtering is normally carried out in an argon atmosphere when films are formed on the anode. The cathode is constructed from the film forming material. The argon is ionized and the positive ions are drawn to the cathode where they strike the surface of the cathode with considerable velocity, knocking off particles of the cathode material. These particles are then deposited on the substrate to form the thin film. These films may vary in thickness from a few hundred to a few thousand Angstrom units, depending on the circuit application required.

Compound films can be formed by reaction between the cathode material and the ionized gas of the sputtering atmosphere. For example, it is possible to form films of tantalum nitride and tantalum oxide by introducing nitrogen and oxygen respectively into the argon atmosphere.

Known apparatus for the preparation of thin films on insulating substrates have almost universally used a horizontal rotary table on which a number of small substrates are supported with a horizontally mounted electrode positioned over the rotating table. In view of the difficulty encountered in enclosing such apparatus within a vacuum chamber the development of apparatus suitable for depositing thin films on large numbers of substrates of a substantial size has not taken place prior to the present invention. Thus, the existing apparatus has been capable of producing a limited number of small substrates, has required an impracticably large diameter turntable to hold large substrates and has encountered problems due to differential expansion on heating due to the rigidity of the rotary turn-table. Sputtering electrodes mounted in the horizontal plane are also readily contaminated with particles settling on the surface due to gravity and thus the thin films deposited with the existing apparatus have not been as pure as is desirable for high quality circuits.

The present invention provides a new and improved sputtering apparatus which is capable of handling a large number of substrates of substantial size within a restricted space and within a vacuum vessel which may be simply constructed and evacuated. The apparatus of the present invention utilizes a folded flexible conveyor on which the individual substrates are mounted and passed vertically between the anode and cathode of the sputtering system, which are also mounted in the vertical plane. Numerous advantages are obtained from this arrangement since the length of the flexible conveyor is much less restricted. Hence, a large number of substrates may be handled in one evacuation of the chamber. Lateral movement of the conveyer may be incorporated to provide for the sputtering of very large substrates. The vertical mounting of the electrodes allows close spacing of the conveyer path and hence a saving in space in the vacuum system. The sputtering electrodes being vertically mounted allows particles to drop free from the sputtering zone thus preventing contamination of the thin film deposited and improving the quality of the film. The structure of the present invention also is flexible and is not subject to problems due to differential expansion on heating, or problems created by close tolerance bearings operated in a high temperature vacuum. A further feature of the invention is that the apparatus permits the inclusion of masks or shutters which may readily be manipulated in the vertical plane, whereas in the horizontal plane such masks or shutters require more space and higher friction forces are involved. Further, large surface masks mounted horizontally are subject to sag at high temperatures thereby destroying the accuracy of the masks. Similarly with the apparatus of the present invention the substrates which are positioned vertically are not as prone to sag as when supported horizontally. The vertical assembly of the electrodes also allows for more convenient adjustment of the anode to cathode spacing. The vertical assembly of the apparatus permits the use of a "Bell Jar" like container with one sealing flange. This container may be lifted vertically to expose all parts of the sputtering apparatus for maintenance. The conveyer of the present invention preferably is folded one or more times so that a larger number of substrates mounted on the conveyer may be accommodated within the vacuum chamber.

Figure 2:
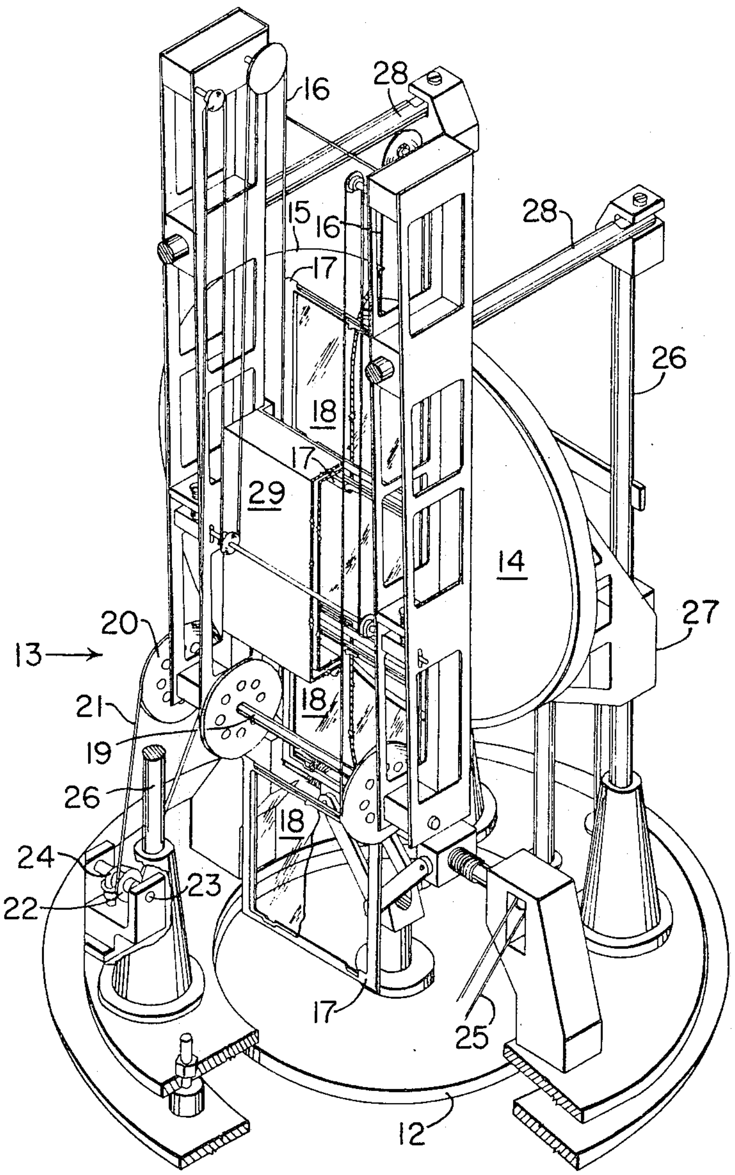
Figure 3:
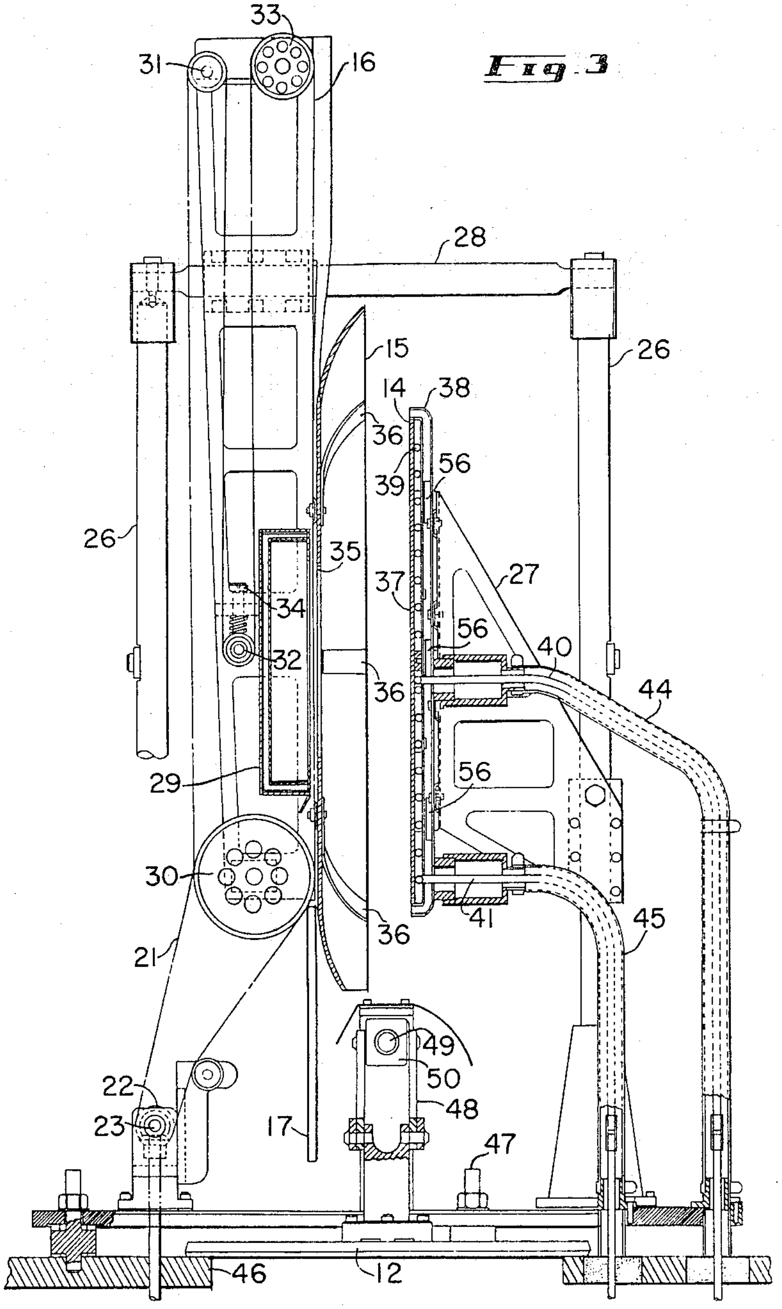
Figure 4:
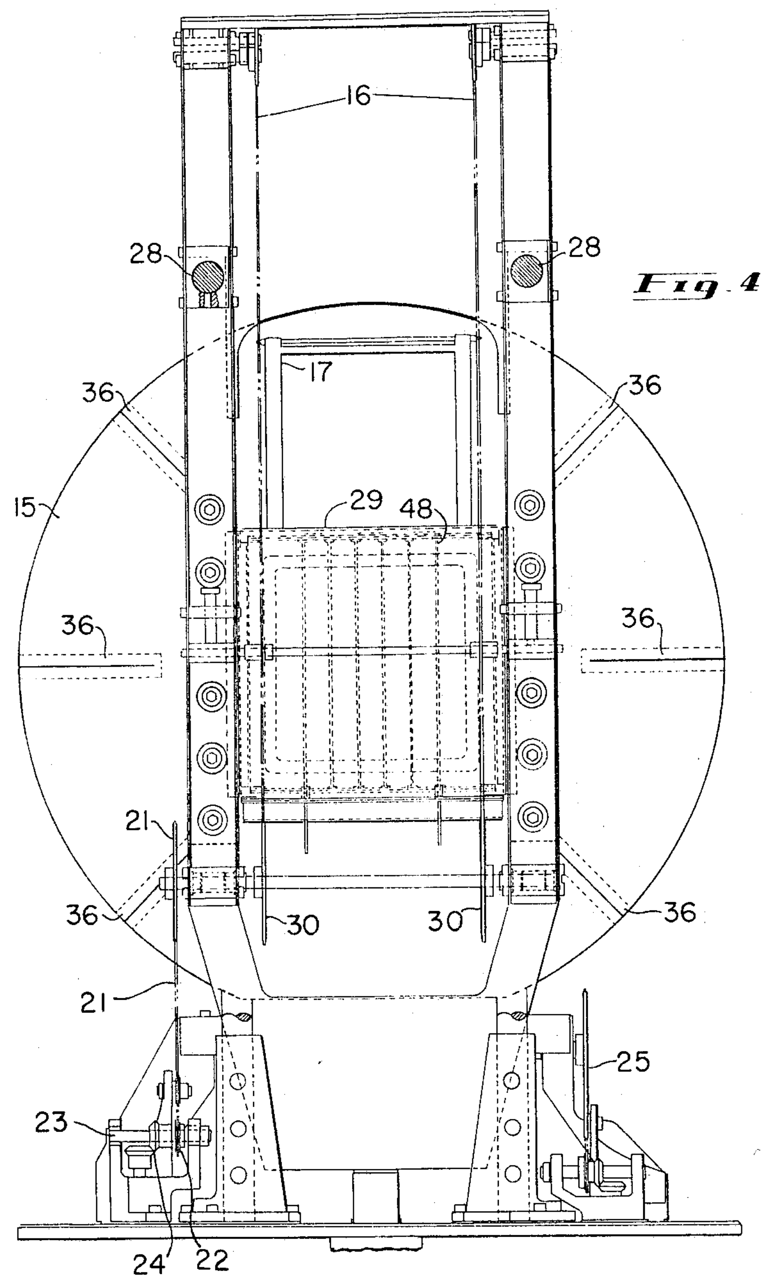
Figure 5:
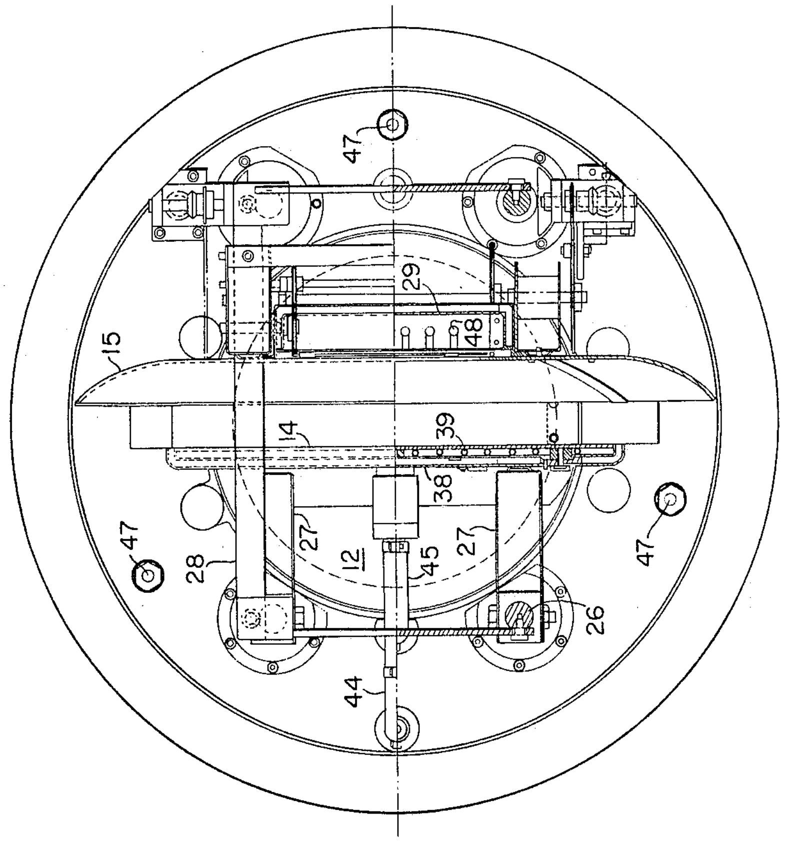
Figures 6, 7:
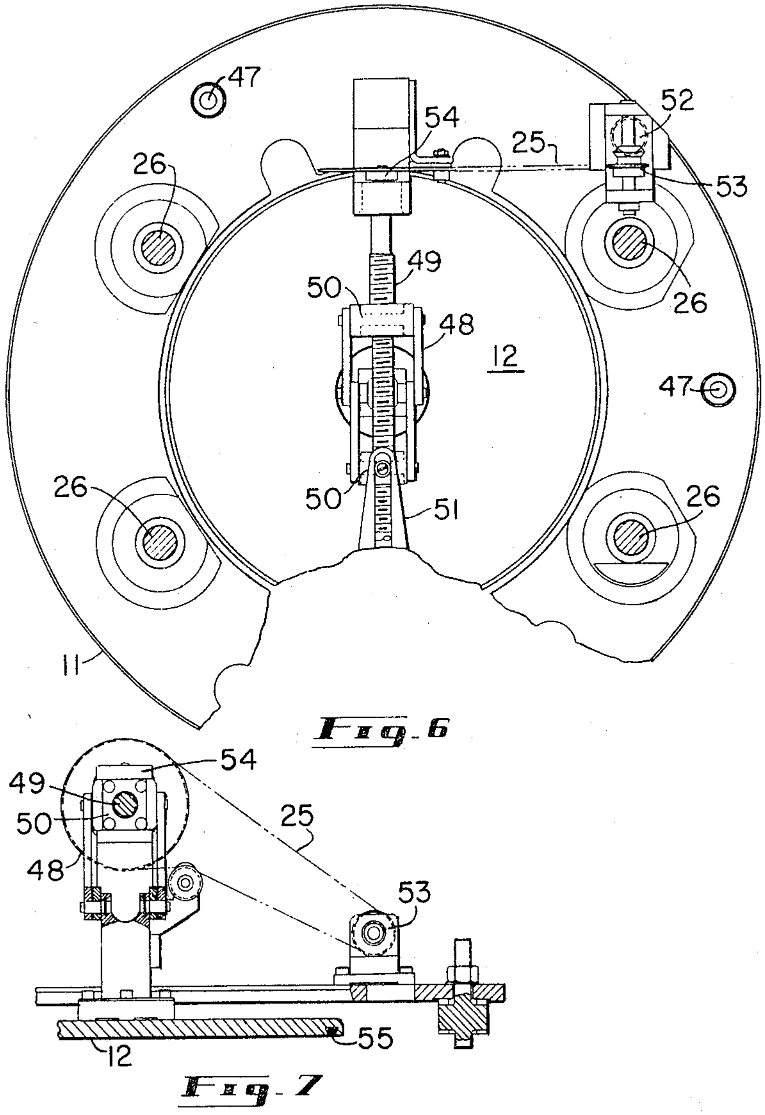
Figure 9:
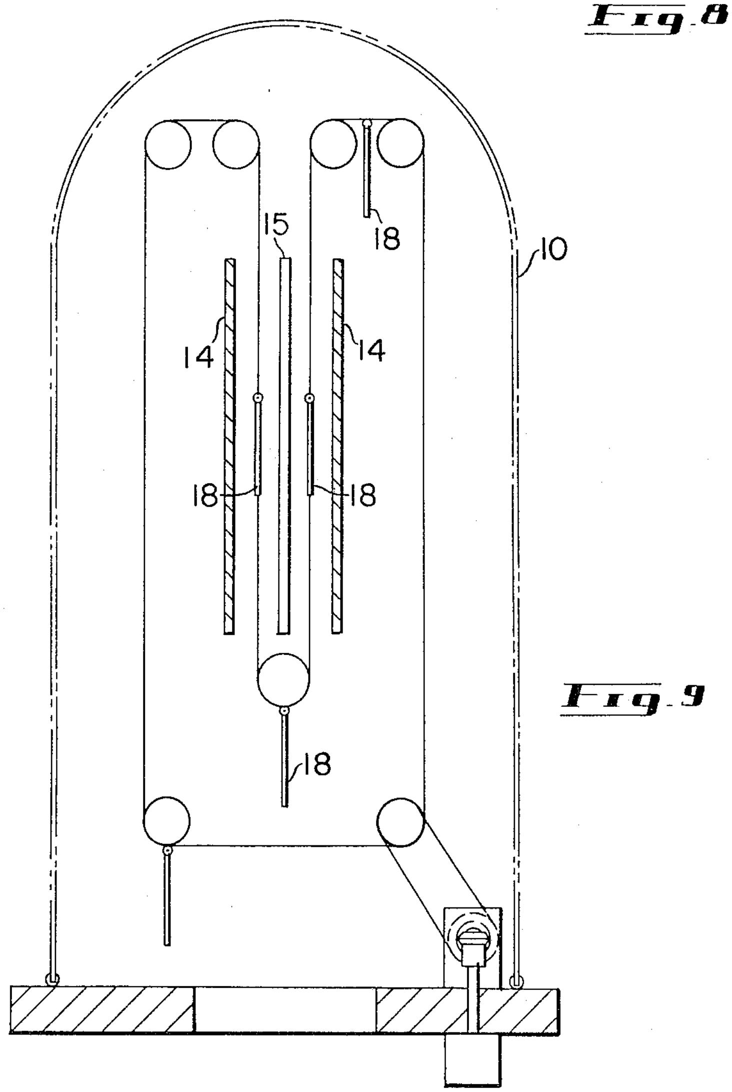

The present invention also includes numerous novel features which will be pointed out more particularly in the description of the drawings which follows:

In drawings which illustrate embodiments of the invention;

FIGURE 1 is a perspective of apparatus in accordance with the invention with the vacuum chamber partially removed from the sputtering apparatus, FIGURE 2 is a perspective view of the sputtering apparatus of the present invention, FIGURE 3 is a vertical cross-section of apparatus in accordance with the present invention, FIGURE 4 is a front elevation of apparatus in accordance with the invention, FIGURE 5 is a plan view of the apparatus, FIG. 6 is a plan view of the baffle assembly, FIGURE 7 is a section of the baffle and its associated operating mechanism, FIGURE 9 is a detail of the baffle assembly drive.

In FIGURE 1 the sputtering apparatus of one embodiment of the present invention is shown with the vacuum chamber enclosure or "Bell Jar" 10 partially removed from the base plate 11. The baffle 12 is shown positioned over the orifice (not shown) to which the vacuum pump for evacuating the chamber 10 is connected. The chamber 10 is provided with suitable sealing means on its lower edge, such as an O-ring seal, for sealing engagement with the base plate 11. Preferably, the chamber 10 is also provided with a heater (not shown) to assist in removing any adsorbed or absorbed gases, during evacuation and prior to sputtering. The chamber 10 may also be provided with view ports to see the operation of the apparatus. The sputtering apparatus indicated generally by the arrow 13 is enclosed within the chamber 10 which is evacuated during operation of the apparatus.

FIGURE 2 shows the sputtering apparatus 13 with the vacuum chamber 10 removed so that the internal construction may be more readily seen. The sputtering apparatus consists of a sputtering cathode 14, an anode 15 and a flexible folded chain conveyor 16 carrying substrate holders 17 in which the substrates 18 are mounted. The conveyor 16 is driven by a shaft 19 to which is connected a sprocket 20 which is in turn driven by a chain 21. The chain 21 is driven by a sprocket 22 mounted on a shaft 23 and driven by bevel gears 24. A motor mounted outside the vacuum enclosure is coupled to the bevel gears 24 by means of a magnetic through-the-vacuum coupling to drive the conveyor 16. Similarly the baffle 12 is positioned by means of a drive chain 25 coupled to a motor mounted externally of the vacuum chamber by means of a through-the-vacuum coupling. As shown in FIGURE 2 means are provided for supporting the anode, cathode and chain conveyor which consist of four vertical legs 26, of which only two may be seen in the view of FIGURE 2, the cathode 14 is supported on one pair of vertical legs by means of a pair of brackets 27 of which only one is visible in FIGURE 2. A pair of horizontal bars 28 are clamped to the upper ends of the legs 26 and support the anode 15, the chain conveyer 16 and their associated apparatus. By mounting the anode 15 and the chain conveyer 16 to the horizontal bars 28, the position of the anode 15 and the chain conveyer 16 with respect to the anode 14 may readily be varied to change the cathode to anode spacing depending upon the specific sputtering operation being carried out. The anode 15 is provided with an aperture which is not visible in the view of FIGURE 2, and behind this aperture a box 29 is positioned. This box contains electrical heaters which are used for heating the substrates during evacuation of the chamber to remove all absorbed and adsorbed gases prior to the application of the thin film.

FIGURE 3 is a vertical section of the apparatus of FIGURE 2 showing more clearly the relative arrangement of the component parts. The legs 26 and the horizontal bar 28 are clearly shown in this view as are the anode 15 the cathode 14 the box 29 and the conveyor 16. With regard to conveyor 16 it will be noted that this includes a sprocket 30, a sprocket 31, a spring loaded idler sprocket 32, and a sprocket 33. The spring loaded idler sprocket 32 is included in the conveyor 16 to maintain a constant and uniform tension on the conveyor which tension may be reset by means of the screw 34. The aperture 35 in the anode 15 is also clearly visible in this view, and the method of making the anode 15 from a flat sheet may be observed as well.

The anode 15 may be constructed using spinning techniques. The curved edge of the outer rim is cut to relieve stress formed at high temperatures. Small strips shown at 36 are positioned over the cuts.

The structure of the cathode 14 may also be observed from FIGURE 3. The cathode 14 is constructed of a tantalum plate 37 with a copper cooling coil 39 mechanically attached. The inlet 40 and outlet 41 of the copper cooling coil 39 are used for a supply and drain for tap water. The cathode and cooling coil are held at a low negative potential 2000 to 5000 v. below ground and all other parts of the sputtering system are grounded. Isolation of the cathode from the rest of the apparatus is achieved by the use of disc insulators 56, and the use of ceramic insulation around the cooling water tubing where it passes through the baseplate. Excessive leakage to ground through the cooling water is avoided by the use of 10 feet of ¼ inch insulating tubing on the inlet and outlet. Sputtering from the back of the cathode and from the cooling tubes is avoided by the use of shielding 38, 42, 43, 44, and 45. This shielding is grounded and is located within the cathode dark space of the sputtering glow discharge.

It may also be seen in FIGURE 3 that the baffle 12 is positioned in its lowest position against the orifice 46. The gas inlet 47 is also shown immediately above the baffle structure 12. However, the inert gas inlet is not shown in full detail, as in practice the length of the pipe extending above the inlet itself will be considerably greater than shown in FIGURE 3.

FIGURE 4 is a rear elevation of the apparatus of the invention more clearly showing the drive mechanism for the conveyor and the baffle structure. In FIGURE 4 the heaters 48 mounted within the box 29 are clearly shown in phantom and the full view of a substrate holder 17 may be seen. The structure of the anode 15 is more fully shown in this view and the strips 36 covering the slots may be clearly discerned.

FIGURE 5 is a partial plan view of the apparatus of the invention. The lower half of the view being in section through the centre of the sputtering zone. The cathode 14 and the cooling coil 39 together with the steel backing plate 38 are clearly shown in this view. The heaters 48 and the box 29 are also shown in section. The three gas inlets 47 may also clearly be seen in this view.

FIGURE 6 is a plan view illustrating the baffle structure of the present invention with the remainder of the sputtering aparatus removed. It may be seen that the baffle 12 is suspended by a lever linkage system 48 from a threaded shaft 49. Internally threaded blocks 50 are mounted on the shaft 49 and are prevented from rotating with the shaft 49 by a brace 51. Thus, when the shaft 49 is rotated the blocks 50 will either move closer together or be separated to raise and lower the baffle 12. The rotation of the shaft 49 is brought about by a motor mounted externally of the vacuum chamber and coupled by via a magnetic coupling to the bevel gears 52 driving the sprocket 53 which drives the chain 25 which in turn drives the sprocket 54 fixed to the end of the shaft 49. Thus the position of baffle may be regulated during operation of the apparatus to give the most efficient operation of the sputtering apparatus.

Figure 8:
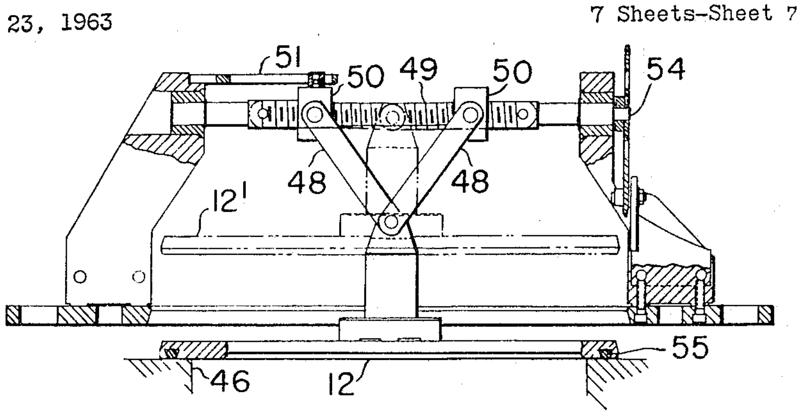

FIGURES 7 and 8 are cross sections of the baffle structure and clearly show the gasket 55 positioned in the lower face of the baffle by means of which the baffle may be tightly sealed against the orifice 46 to prevent the loss of vacuum in the system. In FIGURE 8 the reference numeral 12¹ refers to the baffle in its raised position and the reference numeral 12 refers to the baffle when it is fully lowered against the orifice 46.

Apparatus in accordance with the embodiment illustrated has been constructed and successfully operated. The structure of this actual embodiment will now be described.

One of the greatest drawbacks to sputtering technique is the slowness of the process and the contamination of the deposit by the gettering of the residual gases in the vacuum system. It has been shown that a residual nitrogen atmosphere of the order of $10^{-5}$ mm. Hg affects the specific resistivity and the temperature coefficient of resistance of tantalum films. It is therefore necessary to use an ultra high vacuum system which can be baked out at 300° C. and pumped to a pressure in the low $10^{-8}$ mm. Hg range within two hours.

High production capacity is achieved by incorporating a flexible conveyor system carrying 15 frames 6½" by 6½". These frames hold a single substrate or many small substrates and can carry the substrates in turn to the zone of greatest sputtering efficiency.

A period of presputtering is necessary in order to clean up the vacuum system and remove impurity gases liberated by ion bombardment. In conventional systems the presputtering is carried out on a removable shutter. It is convenient, however, to do the presputtering operation on the first substrate mounted on the conveyor. This substrate would later be discarded.

Conventional vacuum systems operating in the $10^{-5}$ mm. Hg $10^{-6}$ mm. Hg range incorporate a high vacuum valve which can be used as a baffle during sputtering. This baffle enables one to operate the sputtering chamber at a relatively high pressure in the $10^{-3}$ mm. Hg range without choking the diffusion pump which operates below the baffle in the $10^{-4}$ mm. Hg or $10^{-5}$ mm. range. The cost of a bakeable high vacuum valve for the 10" pumping system used would be prohibitive, therefore an adjustable baffle is provided to serve the same purpose.

The conveyor mechanism and the adjustable baffle contains bearings which must be bakeable to 300° C. for long periods of time and freely operable at pressures of $10^{-8}$ mm. Hg. The use of lubricants is impossible because of the contamination problems.

Two rotary feed-throughs are required for this system, one for the adjustable baffle and one for the substrate conveyor mechanism. For this purpose commercially available magnetic couplings were used having a capacity of 6 foot-pounds.

The pumping system used with this embodiment of the present invention consists of a CVC PMCU 4101 10" diffusion pump operating on Dow Corning 704 oil. Back streaming is minimized by the use of a water cooled chevron baffle, and a liquid nitrogen cooled chevron baffle.

The diffusion pump is backed by a Haraeus DK 45A 24 c.f.m. rotary mechanical pump located on the floor below the pumping system.

*Bakeable belljar*

The belljar (FIG. 1) consists of a cylindrical stainless steel tank 24" in diameter by 40" high. Electric heaters having a capacity of 12 kw. are strapped to the outside of the jar. A copper cooling coil surrounds each of the nine heating strips. Two inches of magnesia insulation are used and the whole assembly is covered with a dust proof sheath and an aluminum casing.

The seal between the belljar and the baseplate is achieved by using a single Viton A O-ring. The flange containing the O-ring and the baseplate immediately under the O-ring are not insulated and have separate water cooling coils attached. The belljar has 3 sight ports, one on the top which can be used for lighting and one on each side which can be used for visual observation. The sight ports are herculite glass and are flanged with gold seals. The baseplate is equipped with two magnetic couplings described above, as well as the many feed-throughs which might be required for a variety of vacuum operations. The feed-throughs are flanged to the baseplate using gold gaskets.

A secondary baseplate was used for the mounting of the sputtering apparatus (FIG. 2) in order to avoid machining the base plate of the vacuum system. The large holes bored in the secondary base plate were necessary in order to maintain the conductance of the pumping system when the adjustable baffle was in its raised position.

The parts used for the sputtering apparatus were type 304 stainless steel with the exception of the bearings, the insulators, the wire heater elements, the conveyor springs and the copper cooling coils. A frame made from stainless steel bar stock holds the cathode and the anode in a vertical position. The joints of this frame are so designed to allow for thermal expansion.

The cathode is large in order to achieve high sputtering rates and give good uniformity on large substrates. It consists of a tantalum plate 16" in diameter by ⅛" thick. Copper cooling coils are mechanically fastened to the back of the cathode, and the whole assembly is supported by alumina insulators on a back plate which acts as a shield to prevent sputtering from the back surface and the edge of the cathode.

The water cooling connections to the cathode are made through insulated 10 kv. feed-throughs. The electrical connection is also made to the water cooling tubes. The cathode is isolated from ground by a 10' length of ¼" plastic tubing, providing an inlet and outlet for tap water.

The anode (FIG. 3) is in the form of a circular saucer shaped stainless steel disk of 23" diameter by ⅛" thick. Radial slots around the periphery allow for thermal expansion. The anode is designed to collect the tantalum deposit and to avoid contamination of the vacuum system and the substrates suspended on the conveyor behind the anode. A rectangular aperture is located in the centre of the anode for positioning of the substrates. The anode is suspended from the support frame to allow for adjustability of the anode cathode spacing from 1" to 4". The anode disk can be removed from the assembly for cleaning of deposits.

The substrate conveyor is suspended on two channel members behind the anode and supports a system of chains and sprockets on which the substrate frames, or work holders, are supported. There are 15 work stations on the conveyor chain. These are equally spaced and the chain conveyor can be operated continuously or intermittently. A drive chain connected by a gear system to a magnetic coupling is used to provide external power. The bearings are polished stainless steel journals running in silver bushings. The clearance of the bearings are approximately .020" to allow for thermal expansion. The tension on the chain is maintained by the use of Iconel-X springs. These springs will withstand bake out up to 300° C. without significant change in tension.

The work holders used to support the substrates are open type 310 stainless steel frames into which glass substrates 6" by 6" by .048" can be freely fitted. The work holders in turn are easily mounted in open baskets for cleaning and degreasing purposes. The substrate holders are loosely suspended from cross members on the conveyor chain. This allows the holders to swing freely when the chain passes over the sprockets.

The work heater is a tantalum wire wound on quartz insulators and is located behind the opening in the anode shield spaced away from the anode shield sufficiently far to allow the conveyor to pass between the work heater and the shield. The back of the work heater consists of a double walled polished stainless steel radiation shield. One side of the element is grounded and the other side is connected to a variable transformer.

The baffle plate consists of a stainless steel disk approximately the same diameter as the throat of the pump. This disk can be raised to a distance of 3½" above the baseplate by the use of a threaded horizontal support connected to the baffle with levers in a scissors fashion (FIG. 2). The threaded screw which operates the baffle is connected to the second magnetic coupling by means of a gear and chain arrangement. The lower most position of the baffle as used during sputtering is controlled by placing thin copper spacers on the baseplate underneath the baffle. The bearings supporting the baffle and acting as threaded nuts on the drive screw are made of fine silver. The drive screw is a coarse square thread with a polished surface.

One magnetic coupling used to transfer the power into the vacuum system is motor driven by means of a belt connected to a variable speed motor. This coupling provides smooth operation of the conveyor mechanism and is clutched to slip if a torque exceeds 6 foot-pounds, in the event of a failure in the mechanism. The second coupling is operated manually for raising and lowering the baffle plate.

The gauging used in the vacuum system consists of two conventional Pirani gauges and a nude ion gauge, model #VAC–NIG, of the Rayard-Alpert type. The ion gauge is mounted in the baseplate. One Pirani gauge is also in the baseplate and is used during sputtering. The other Pirani gauge is located in the foreline.

Substrate cleaning is facilitated by the use of racks. Each rack holds eight frames containing 6" x 6" substrates. The substrates are mounted prior to cleaning, and remain in the racks during processing through the ultrasonic cleaning in hot water wetting agent, a hot 5% hydrogen peroxide solution, spray rinses, and a final degreasing operation in isopropyl alcohol immediately prior to mounting in the vacuum system. The bottom of the cleaning rack is cut away to allow for good drainage and efficient ultrasonic cleaning.

The vacuum system has operated efficiently and after prolonged exposure to the atmosphere will pump the system to $10^{-7}$ mm. Hg range within 30 minutes. It has been found that with short exposure of the order of 15 minutes, required for loading and unloading of the conveyor, the system can be pumped to the high $10^{-8}$ mm. Hg range in 30 minutes. Overnight bake out of the belljar to 300° C. is done without liquid nitrogen on the Chevron baffle and the pressure achieved is in the high $10^{-7}$ mm. Hg range. Cooling after bake out by circulating water through the cooling coils and by putting liquid nitrogen through the baffle gives a pressure of $3 \times 10^{-8}$ mm. Hg after two hours. Prolonged pumping for a period of an additional four hours gives an ultimate pressure of $8 \times 10^{-9}$ mm. Hg. It was found however that after sputtering for one hour the system can be pumped to an ultimate pressure of $2 \times 10^{-9}$ mm. Hg. The pump down time after sputtering for one hour in argon at a pressure of 50 microns was amazingly fast and the pressure would drop to the high $10^{-9}$ mm. Hg range within 10 minutes. The background pressure during sputtering was estimated by dropping the baffle to the sputtering position approximately 1/16" above the baseplate and measuring the pressure on the ion gauge. Pressure readings with the baffle in the down position were $5 \times 10^{-8}$ mm. Hg before presputtering and $8 \times 10^{-9}$ mm Hg after presputtering. This would indicate that the sputtering operating either releases gases from the walls of the chamber which can then be pumped out, or getters the impurity gases in the tantalum deposit formed.

Mass spectrometer analysis conducted on the residual gases before and after sputtering at a pressure of $5 \times 10^{-8}$ mm. Hg indicated a higher proportion of the lower atomic weight gases after the sputtering operation. This would indicate that these gases have been either released from the surface of the chamber or that large molecules have been cracked.

Rates in excess of 500 A. per minute have been measured at a sputtering voltage of 4,500 volts, 500 ma. in an atmosphere of 35 microns of argon. The specific resistivity of material deposited at this rate was found to be of the order of 15 to 20 microhm centimeters.

The uniformity of deposits is within 5% over an area of 4" x 4" and is within 15% over the 6" by 6" area of the substrate. It has been found that uniformity is better on intermittent operations than on continuous operation of the conveyor.

Control of heating of the substrates presents some problems in that a thermocouple intereferes with operation of the conveyor. Non uniform heating leads to non uniform sheet resistance of the deposit, and when the voltage on the heater exceeds 20 volts the effect can be noticed on the glow discharge. This effect appears to be a flashing at approximately 30 cycles per second. The heater provides approximately 500 watts at 20 volts. During bakeout of the system the conveyor is left running continuously and the heater voltage is increased to approximately 40 volts in order to bakeout the glass substrates.

Problems were encountered with bearings throughout the system. Initially bearings were made of copper and some seizure and wiping occurred during bakeout. The substitution of fine silver bearings eliminated this problem and the system runs smoothly during bakeout at 300° C. at pressures in the $10^{-7}$ mm. Hg range for periods as long as 72 hours.

Considerably difficulty was originally experienced in the operation of the baffle and here again it was found necessary to use fine silver bearings and to substitute a coarse square thread for a much stronger but finer thread used initially.

In use the cleaned and dried substrates 18 are placed in the substrate holders 17 and the vacuum chamber 10 is lowered to seal against the baseplate 11. The vacuum pump is started and heat is applied to the vacuum chamber 10 to assist in "out gassing" the vacuum chamber. The conveyor 16 is operated to convey each of the substrates 18 past the heater box 29 so that each of the substrates is also heated to drive off any sorbed gases. After the evacuation and "out gassing" of the vacuum chamber is completed a controlled amount of gas is introduced into the chamber through the gas inlets 47 and the appropriate voltage is applied to the cathode 14 to ionize the gases and cause the sputtering of molecules from the cathode 14 onto the substrates which are successively positioned in front of the aperture 35 by intermittent motion of the conveyor 16. After all substrates have been coated with a suitable thickness of film the sputtering voltage is removed and the chamber is allowed to cool and to return to atmospheric pressure pressure. The chamber is then opened and the substrates with the thin film are removed for further processing into thin-film circuits. During sputtering the cathode 14 tends to become very hot and accordingly water is passed through the cooling coil 39 to prevent over-heating and distortion of the cathode 14.

FIGURE 9 is a schematic drawing illustrating the coating of substrate on both sides during one evacuation of the chamber 10. Substrates 18 are shown in the apparatus together with two tantalum cathodes 14 between which is positioned a sputtering anode 15. The substrates 18 pass successively between one of the cathode and the anode and between the other cathode and anode. Thus both sides of the substrates 18 will be coated while they pass progressively between the anodes 14 and the cathode 15.

We claim:

1. In a sputtering apparatus for the production of thin films on flat substrates the improvement comprising the combination of a vertical sputtering cathode, a vertical sputtering anode positioned in juxtaposed relationship with said cathode and provided with an aperture through which said substrates may be coated, and a folded flexible conveyor adapted to carry substrates past said aperture on the side of said anode remote from said cathode to permit the deposition of the thin film thereon.

2. In a sputtering apparatus in accordance with claim 1, substrate holders hingedly fixed to said flexible conveyor to permit said substrates to hang vertically on said conveyor.

3. Apparatus in accordance with claim 1 wherein said folded flexible conveyor comprises a pair of spaced apart conveyor chains with substrate holders fixed to each of said chains and adapted to hang vertically between said chains, said chains being simultaneously driven to position successive substrates adajacent said aperture.

4. Apparatus for depositing thin films on flat substrates by sputtering the film from a cathode comprising, a vacuum chamber enclosing a vertically positioned cathode, a vertically positioned anode in spaced juxtaposed relationship with said cathode and having an aperture therein, a flexible conveyor adapted to position successive substrates adjacent said aperture and on the side of said anode remote from said cathode for the deposition of the film thereon, cathode cooling means, and means for introducing an inert gas into said evacuated chamber and to cause the ionization thereof whereupon said thin film is deposited on said substrates.

5. Apparatus according to claim 4 wherein said flexible conveyor is folded to carry a substantial number of substrates within said evacuated chamber, and a plurality of substrate holders are mounted on said conveyor and adapted to hold the subtstrates in substantially vertical position adjacent said aperture.

6. Apparatus according to claim 5 including conveyor mounting and drive means to cause vertical motion of the substrate carriers past said aperture.

7. Apparatus according to claim 6 including means for evacuating said chamber including a baffle assembly positioned over an orifice in the evacuating means and adapted to be moved with relation to said orifice to control the evacuation of said chamber.

8. Apparatus according to claim 4 including means mounted on the side of said conveyor remote from said anode and cathode for heating substrates positioned behind said aperture.

9. Apparatus according to claim 4 including means for heating said chamber during evacuation thereof to improve the "out gassing" of said chamber.

10. Apparatus according to claim 4 including cathode and anode mounting means, said means being adjustable to vary the cathode to anode spacing.

11. Apparatus according to claim 10 wherein said flexible conveyor is supported by said cathode and anode mounts and is adapted to move with said anode when the cathode to anode spacing is varied.

12. Apparatus according to claim 11 and including means to maintain a predetermined tension on said conveyor.

13. Apparatus according to claim 12 wherein said conveyor consists of a pair of parallel chains and said substrate holders are suspended between said chains and adapted to hang vertically.

14. Apparatus according to claim 1 wherein all bearings used for rotary motion in said apparatus are polished stainless steel running in fine silver bushings.

References Cited by the Examiner

UNITED STATES PATENTS

| | | | |
|---|---|---|---|
| 395,963 | 1/1889 | Edison | 204—192 |
| 1,412,593 | 4/1922 | Allsop | 198—154 |
| 2,734,478 | 2/1956 | Reynolds et al. | 118—8 |
| 2,847,325 | 8/1958 | Riseman et al. | 204—192 |
| 3,133,874 | 5/1964 | Morris | 204—298 |

JOHN H. MACK, *Primary Examiner.*

R. K. MIHALEK, *Assistant Examiner.*